United States Patent

[11] 3,620,734

[72] Inventor Edward J. Cerwonka
Binghamton, N.Y.
[21] Appl. No. 758,606
[22] Filed Sept. 9, 1968
[45] Patented Nov. 16, 1971
[73] Assignee GAF Corporation
New York, N.Y.

[54] POSITIVE-WORKING PHOTOPOLYMERIZATION PROCESS
9 Claims, No Drawings

[52] U.S. Cl. .......... 96/35.1, 96/115 P
[51] Int. Cl. .......... G03c 5/00
[50] Field of Search .......... 96/36.2, 35.1, 115 P

[56] References Cited

UNITED STATES PATENTS 3,110,592 11/1963 Schwerin et al. .......... 96/115 P
3,138,460 6/1964 Levinos .......... 96/115 P

FOREIGN PATENTS 926,583 5/1963 Great Britain .......... 96/36

OTHER REFERENCES

A. K. Schwerin, F. W. Millard, Photo. Sci. Eng., 6(4), July-Aug 1962, pps. 231-234.

*Primary Examiner*—Norman G. Torchin
*Assistant Examiner*—John Winkelman
*Attorneys*—Walter G. Hensel, Walter C. Kehm and Samson B. Leavitt

ABSTRACT: A process of photopolymerizing monomers comprising contacting said monomers with a light-sensitive diazonium salt exposing the composition to actinic radiation and subsequently immersing the composition in a processing bath which comprises a compound selected from the group consisting of ferrous ammonium sulfate or hydroquinone.

POSITIVE-WORKING PHOTOPOLYMERIZATION PROCESS

The instant invention pertains to a photopolymerization process and in particular, to an improved method of producing positive images by photopolymerization. The majority of photo reproduction processes which are based on photopolymerization yield negative images rather than positive images. That is to say that the image which is formed appears in the areas which are exposed to light. Processes such as dye-sensitized photopolymerization wherein a dye is used in conjunction with a reducing agent to cause photopolymerization are typical of this type of process. In addition, in processes in which a metal salt such as a ferric compound is used to photopolymerize vinyl monomers, the resulting image is a negative image.

Also known in the prior art are a few processes which like the instant invention result in the formation of a positive image. These include processes in which a photosensitive layer comprising an ethylenically unsaturated compound and a diazonium compound is treated, after exposure, with a redox system comprising a salt of a divalent metal and a per compound. A variation of this process is one in which heat is employed in connection with the above reactants.

Another positive image-forming system is one in which the monomer to be polymerized is incorporated into a silver halide emulsion. Following exposure, the coated layer is immersed successively in each of two processing baths; the first bath is comprised of ferrous oxalate solution which acts as a developer for the exposed silver halide. The second bath is hydrogen peroxide. In this process, ferrous ion is oxidized to ferric ion so as to eliminate the ferrous ion adsorbed in the exposed areas so that it cannot react with the hydrogen peroxide to yield the initiating radicals for polymerization. The end result of this process is a positive image.

In yet another positive image process, heat effects a reaction between a diazonium salt and its photolytic products in the presence of a vinyl monomer. The system is said to be controlled to yield either a positive or negative image by adjustment of the proportion of reactants. All of these positive-image-forming photopolymerization processes are rather complex and difficult to employ in reproduction methods.

Therefore, it is an object of the instant invention to provide a positive image forming photopolymerization process in which a photo reproduction is obtained by means of photopolymerizing a vinyl monomer in the presence of a diazonium compound.

Another object of the instant invention is to provide a photopolymerization process which yields positive images through the action of a diazonium compound which is subsequently contracted with ferrous ammonium sulfate.

Yet, another object of the instant invention is to provide a photopolymerization process which yields positive images through the action of a diazonium compound which is subsequently contacted with hydroquinone.

These and other objects of the instant invention will become more apparent to those skilled in the art from the following more detailed discussion thereof.

According to the present invention a positive polymeric image is obtained with an appropriate light-sensitive compound is exposed to actinic radiation, immersed in a single processing bath, and subjected to a washout. Suitable light-sensitive compounds which may be employed in connection with the instant invention are light-sensitive diazonium compounds.

Diazonium salts suitable for this invention include aromatic diazonium compounds with or without nuclear substituents which may include alkyl, alkoxyl, acetamido, carboalkoxyl, hydroxyl, aryl, halogen, sulfonate, or sulfone groupings. Amino or alkylamino substituted aromatic diazonium compounds appear to be slightly less effective, as are the so-called diazo-ozides which are prepared from ortho- or para-aminophenols. The more effective diazonium salts seem to be those which are the stronger oxidants. These are the unsubstituted diazonium salts or those possessing so-called negative or electron-attracting substituents such as phenyl or nitro. The less effective diazonium salts are the weaker oxidants with so-called positive or electron-releasing groups, such as, for example, para diethylaminobenzene diazonium chloride.

These compounds may be derived by the diazotization of primary aromatic amines such as are disclosed in U.S. Pats. Nos. 3,178,283; 3,110,592; 2,807,545; and 2,772,972. These diazonium compounds include but are not limited to:

para-diazo-dimethyl-aniline zinc chloride
p-diazo-diphenylamine sulfate
p-diazo-diethylaniline zinc chloride
p-diazo-ethyl-hydroxyethylaniline zinc chloride
p-diazo-ethyl-methyl-aniline zinc chloride
p-diazo-diethyl-methyl-aniline zinc chloride
p-diazo-ethyl-hydroxyethylaniline zinc chloride
1-diazo-2-oxy-naphthalene-4-sulfonate
4-benzoylamine-2-5-diethoxy-benzene diazonium chloride
p-chlorobenzene-sulfonate of 4-diazo-2-methoxy-1-cylohexylamino-benzene
tin chloride double salt of 4-N-methyl-cyclohexyl-amino-benzene diazonium chloride
p-acetamino-benzene diazonium chloride
4-dimethylamino-benzene diazonium chloride
3-methyl-4-diethyl-amino-benzene diazonium chloride
4-morpholine-benzene diazonium chloride
4-piperidyl-2-5-diethoxy-benzene diazonium chloride
1-dimethyl-amino-napthalene-4-diazonium chloride
4-phenyl-amino-benzene diazonium chloride In practice, the diazonium salt is used in the form of its stable diazonium sulfate, chlorobenzene sulfonate, or borofluoride. It is preferred, however, to use the more stable form of a double salt of an acidic reagent such as zinc chloride and stannic chloride or in the form of a complex such as the fluoborate.

The particular salt employed, however, is not critical to the operation of the instant invention.

Any normally liquid to solid photopolymerizable unsaturated organic compound is suitable in the practice of this invention. Preferably, such compounds should be ethylenically unsaturated, i.e. contain at least one nonaromatic double bond between adjacent carbon atoms. Compounds particularly advantageous are the photopolymerizable vinyl or vinylidene compounds containing a $CH_2$=C. < group activated by direct attachment to an electronegative group such as halogen, C=O, —C≡N, —C≡C, —O—. Examples of such photopolymerizable unsaturated organic compounds include acrylamide, acrylonitrile, N-ethanol acrylamide, methacrylic acid, acrylic acid, calcium acrylate, methacrylamide, vinyl acetate, methyl methacrylate, methyl acrylate, ethyl acrylate, vinyl benzoate, vinyl pyrrolidone, vinyl methyl ether, vinyl butyl ether, vinyl isopropyl ether, vinyl isobutyl ether, vinyl butyrate, butadiene or mixtures of ethyl acrylate with vinyl acetate, acrylonitrile with styrene, butadiene with acrylonitrile and the like.

The above ethylenically unsaturated organic compounds, or monomers as they are sometimes called, may be used either alone or in admixture in order to vary the physical properties such as molecular weight, hardness, etc., of the final polymer. Thus, it is a recognized practice, in order to produce a vinyl polymer of the desired physical properties, to polymerize in the presence of a small amount of an unsaturated compound containing at least two terminal vinyl groups each linked to a carbon atom in a straight chain or in a ring. The function of such compounds is to cross-link the polyvinyl chains. This technique, as used in polymerization is further described by Kropa and Bradley in Volume 31, No. 12 of Industrial And Engineering Chemistry, 1939. Among such cross-linking agents for the purpose described herein may be mentioned N,N'-methylene-bis-acrylamide, triallyl cyanurate, divinyl benzene, divinyl ketones and diglycol diacrylate. Generally speaking, increasing the quantity of cross-linking agent increases the hardness of the polymer, particularly in the range wherein the ratio of monomer to cross-linking agent varies from 10:1 to 50:1.

In the instant invention the photopolymerizable composition comprising a light-sensitive diazonium salt and a monomer as delineated above are dissolved in an aqueous solution with a binder. The solution is then coated on a support and subsequently exposed to light. This exposure causes a decomposing of the diazonium salt in an imagewise fashion. The exposed sample is then immersed in an aqueous solution of either ferrous ammonium sulfate or hydroquinone. During the immersion, polymerization takes place in the unexposed areas as a consequence of the reaction between the undecomposed diazonium salt and either the ferrous ammonium sulfate or hydroquinone. The immersion step is followed by a washout with water, the temperature of which is not critical. This washout removes the unpolymerized areas which are those which have received exposure to light and a polymeric image of the unexposed areas remains.

In general, the process involved in the instant invention may be represented by the following equations.

Exposure: $RN_2^+ \xrightarrow{light} R^+ + N_2$

Immersion in ferrous salt or hydroquinone:

$$RN_2^+ + Fe^{+2} \rightarrow RN_2\cdot + Fe^{+3}$$

$$\text{or } RN_2^+ + \text{hydroquinone} \rightarrow RN_2\cdot + \text{quinone}$$

$$RN_2\cdot \rightarrow R\cdot + N_2$$

$$R\cdot \text{ or } RN_2\cdot + \text{monomer} \rightarrow \text{polymer}$$

Binders which are suitable for use in the instant invention are those which are commonly employed in the photographic arts. These include colloid carriers such as polyvinyl alcohol, casein, glue, saponified cellulose acetate, carboxymethylcellulose, hydroxyethylcellulose, starch, polyvinylpyrrolidone, gelatin and the like.

Numerous materials are suitable as supports or bases for the photosensitive composition of the instant invention, such as cellulose ester supports including the hydrophobic variety or the type having a surface made hydrophilic by partial saponification, certain metals such as aluminum or zinc, polyester films, e.g. terephthalic acid ester polymers, paper, glass, and the like.

The amount of diazonium salt incorporated into the coated layer should be kept relatively low for two reasons. The concentration must be low enough so that the diazonium salt may be photolized during the exposure step, otherwise some polymer will appear in the exposed areas (as well as the unexposed areas) by virtue of a reaction which takes place in the immersion step. Secondly, many diazonium salts are weak initiators of polymerization in light, If, therefore, the concentration of diazonium salt is relatively high, sufficient initiating radicals survive to produce polymer in the exposed areas. The actual amount of diazonium salt employed varies with the diazonium salt selected as well as with the monomer content. From 5 milligrams to about 400 milligrams are generally employed, although it is preferred to use from about 20 to 200 milligrams per 25 milliliters of water which contains one-fourth gram of monomer.

The present invention will now be described by reference to the following specific examples. Such examples are presented for purposes of illustration only, and the present invention is in no way to be deemed as limited thereto.

EXAMPLE I

A solution was prepared in red light as follows:

Polyvinylpyrrolidone, K-90 (GAF) 1,000 g.
N,N'-methylenebisacrylamide 0.250 g. (recrystallized twice from water)
para-toluenediazonium fluoborate 0.200 g.
Wetsit, spreading agent, 10 percent aqueous solution 0.08 ml.
Water, deionized to 25 ml.

The solution was poured onto a glass plate that had been appropriately subbed to receive the solution. The coated plate was whirled 5 minutes on a coating machine (Addressograph-Multigraph), then allowed to dry in the dark at room temperature for about an hour.

A sample was cut from the plate and exposed through a Stouffer Graphic Arts step tablet to the light from a 375-watt reflector lamp for a period of 3 minutes at a distance of 15 inches. The light intensity as measured by an ultraviolet light-exposure meter read 640 microwatts per square cm. After the exposure the sample was immersed in an aqueous solution of ferrous ammonium sulfate hexahydrate, 5 percent, for a few seconds. It was then washed in deionized water to remove the unpolymerized areas. A polymeric image remained in the areas receiving least exposure while the areas receiving greatest exposure were found to be clear. The image was therefore a positive photographic image of the step tablet.

EXAMPLE II

A solution such as was described in example 1 was prepared; and para-toluenediazonium chlorozincate, 0.200 g. was substituted for the para-toluenediazonium fluoborate. The operations of coating, drying, exposing and processing were carried out as with the sample described in example 1. A positive photographic image was again obtained similar to that obtained with the sample in example 1.

EXAMPLE III

The following light-sensitive solution was prepared in a dark room (red safelight):

Polyvinylpyrrolidone, K-90 (GAF) 1,000g.
N,N'-methylenebisacrylamide 0.250 g. (recrystallized twice from water)
para-nitrobenzenediazonium fluoborate 0.020 g.
Wetsit, spreading agent, 10 percent aqueous solution 0.08 ml.
Water, deionized to 25 ml.

The operations of coating, drying and exposing were carried out in the manner prescribed for the sample in example 1. The exposed sample was immersed in an aqueous solution of hydroquinone, 5 percent. After washout with deionized water, a positive photographic image was again obtained, as in the case of the samples in examples 1 and 2.

EXAMPLE IV

A solution such as was described in example 1 was prepared, and p-diethylaminobenzene diazonium fluoborate, 0.200 g. was substituted for the para-toluenediazonium fluoborate. The operations of coating, drying, exposing and processing were carried out as with the sample described in example 1. A positive photographic image was again obtained similar to that obtained with the sample of example 1.

EXAMPLE V

A solution was prepared as described in example 3 and para-toluene diazonium chlorozincate, 0.020 g. was substitute for para-nitrobenzenediazonium fluoborate. The operations of coating, drying, exposing and processing were carried out as with the sample described in example 3. A positive photographic image was again obtained similar to that obtained with the sample of example 3.

EXAMPLE VI

A solution such as was described in example 3 was prepared and para-toluenediazonium fluoborate, 0.020 g. was substituted for the para-nitrobenzenediazonium fluoborate. The operations of coating, drying, exposing and processing were carried out as with the sample described in example 3. A positive photographic image was again obtained similar to that obtained with the sample of example 3.

While various preferred embodiments of the present invention have been illustrated by way of specific examples, it is to be understood that the present invention is in no way to be deemed as limited thereto, but should be construed as broadly as all or any equivalents thereof.

The above examples are illustrative of the manner in which photosensitive compositions of the type disclosed herein can be used for the production of positive photographic polymeric images. Any of the photosensitive compositions obtained in the preceding examples or disclosed in the specification can also be employed in a similar manner.

What is claimed is:

1. A process for the production of a positive polymeric image which consists of the steps of (1) exposing a normally liquid to normally solid monomer containing the grouping $CH_2$=CH< to actinic radiation in presence of an aromatic diazonium compound (2) contacting the exposed monomer with a reducing agent selected from the group consisting of ferrous ammonium sulfate and hydroquinone; and (3) thereafter removing the exposed material by washing.

2. The process as defined in claim 1 wherein the reducing agent is ferrous ammonium sulfate.

3. The process as defined in claim 1 wherein the reducing agent is hydroquinone.

4. The process as defined in claim 1 wherein the diazonium compound is para-toluenediazonium fluoborate.

5. The process as defined in claim 1 wherein the diazonium compound is para-toluenediazonium chlorozincate.

6. The process as defined in claim 1 wherein the diazonium compound is para-nitrobenzenediazonium fluoborate.

7. A process of producing by photopolymerization a positive polymeric image which consists of the steps of (1) exposing to actinic radiation a photographic element comprising a support having thereon a radiation-sensitive layer comprising a normally liquid to a normally solid monomer containing the grouping $CH_2$=CH<, a colloid carrier therefor and an aromatic diazonium compound; (2) contacting the exposed element with a reducing agent selected from the group consisting of ferrous ammonium sulfate and hydroquinone; and (3) thereafter removing the exposed material by washing.

8. The process as defined in claim 7 wherein the reducing agent is hydroquinone.

9. The process as defined in claim 7 wherein the reducing agent is ferrous ammonium sulfate.

* * * * *

Disclaimer

3,620,734.—*Edward J. Cerwonka,* Binghamton, N.Y. POSITIVE-WORKING PHOTOPOLYMERIZATION PROCESS. Patent dated Nov. 16, 1971. Disclaimer filed Sept. 30, 1982, by the assignee, *Eastman Kodak Co.*

Hereby enters this disclaimer to all claims of said patent.

[*Official Gazette March 22, 1983.*]